(12) United States Patent
Minami

(10) Patent No.: US 6,355,967 B2
(45) Date of Patent: *Mar. 12, 2002

(54) SEMICONDUCTOR DEVICE AND METHOD OF MANUFACTURING THE SAME

(75) Inventor: Toshifumi Minami, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,485

(22) Filed: Apr. 20, 2000

(30) Foreign Application Priority Data

Apr. 22, 1999 (JP) .......................... 11-114583

(51) Int. Cl.⁷ ............................... H01L 29/00
(52) U.S. Cl. ...................... 257/529; 257/528; 257/530; 438/132; 438/215; 438/281; 438/333; 438/467; 438/601
(58) Field of Search ................ 257/529, 530, 257/50, 528, 758, 760, 635; 438/132, 215, 281, 333, 467, 601

(56) References Cited

U.S. PATENT DOCUMENTS 4,413,272 A * 11/1983 Mochizuki et al. ........... 357/65
4,935,801 A * 6/1990 McClure et al. ............... 357/51
5,321,300 A * 6/1994 Usuda et al. ................ 257/529
6,100,118 A * 8/2000 Shin et al. ................... 438/132

OTHER PUBLICATIONS

Copy of application No. 09/522,594 to Sadayuki Mori and Toshifumi Minami, filed Mar. 10, 2000.

* cited by examiner

Primary Examiner—Tom Thomas
Assistant Examiner—Donghee Kang
(74) Attorney, Agent, or Firm—Finnegan, Henderson, Farabow, Garrett & Dunner, L.L.P.

(57) ABSTRACT

In the fuse element structure of the semiconductor device, the first insulating film region is provided in a groove-like manner in the semiconductor substrate. Further, the fuse element is formed on the first insulating film region, and the second insulating film region is formed on the region on the fuse element and the first insulating film. The metal plug is connected to the fuse element, and the surface thereof is exposed to the surface of the second insulating film region. With this structure, the meltdown of the fuse by the laser blow is facilitated, and the area of the fuse is reduced. Thus, as the downsizing of the element is further advanced, it is possible to provide a fuse element structure capable of melting down a fuse without causing an affect on another fuse adjacent to the melted-down fuse with the scattering pieces thereof.

13 Claims, 10 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 11-114583, filed Apr. 22, 1999, the entire contents of which are incorporated herein by reference.

BACKGROUND OF THE INVENTION

The present invention relates to a semiconductor device, and more specifically to a fuse structure of a semiconductor memory device, as well as a method of manufacturing the same, that is, in short to improvement of the fuse structure of a semiconductor memory device.

Recently, in the field of semiconductor integrated circuits, the degree of the high integration further advances, and in particular, in DRAMs, a high integration density of a level of giga bit is required. Further, due to the characteristics of the memory element of the semiconductor memory device, a large-scale redundancy circuit must be inevitably provided. Therefore, the integration density of the semiconductor integrated circuit is further increased. For this reason, it is becoming essential to decrease the area of a fuse element in order to reduce the element area.

A fuse region of a conventional DRAM will now be described with reference to FIGS. 17A and 17B. Here, FIG. 17A is a cross sectional view of the fuse element, whereas FIG. 17B is a top view of the fuse element. A cross section taken along the line XVIIA—XVIIA in FIG. 17B is indicated as FIG. 17A. As can be seen in FIG. 17A, an element separation region 101 is formed in a surface region of a semiconductor substrate 100. On the element separation region 101, an interlayer insulating film 102 having a thickness of about 1.4 μm, which is made of a silicon oxide film or the like. A plurality of metal fuses 103 having a thickness of 2000 to 3000 angstroms, which are made of aluminum or the like, are formed on the interlayer insulating film 102 so as to be adjacent and parallel to each other.

In the structure shown in FIG. 17B, as a laser beam is applied to a fuse portion 104 which is a fusing (meltdown) region, the portion breaks down in a manner of joule breakdown by heat, and fuses. It should be noted here that the length of the fusing region 104 of each one of the fuses 103 is about 1.0 μm, and the width (that is, taken in a direction normal to the direction of the length) of the fuses in a region other than the fusing region 104 is about 0.6 μm. On the fuses 103, an interlayer insulating film 105 having a thickness of about 500 to 5000 angstrom is formed to cover the fuses 103. Please also note that in a fuse region of the prior art technique, a special process step is provided to form a fuse opening section, and a film corresponding to the interlayer insulating film 105 is formed to have a certain thickness on a metal fuse 104.

However, the conventional semiconductor as described above entails the following drawbacks.

That is, in the fuse structure of the conventional technique described above, the interval between fuses is narrowed as the element is downsized. With this structure, when broken pieces of a fuse are scattered from a melted-down fuse and stuck on some other fuse which should not be melted down, the erroneous meltdown of that fuse which should not be melted down, or the change in the resistance of the fuse (or the corresponding circuit) are induced, creating a problem that a desired element operation cannot be guaranteed. Further, as the wire is multi-layered, the thickness of the film cannot be made uniform any more from one site to another in the interlayer insulating film. Therefore, when a plurality of fuses are provided, the thickness of the portion of the insulation film, which is located on each fuse differs from one portion to another. As a result, when a laser beam is applied uniformly onto a plurality of fuses, insufficient meltdown or excessive meltdown may occur. Further, in the case where the interlayer insulating film formed underneath fuses is multi-layered, the stress of a fuse which is scattered into pieces while the meltdown of the fuse is easily propagated between insulating films made of different compositions, and therefore in some cases, a fuse which should not be melted down is melted due to the propagated stress. In order to prevent such a phenomenon, the energy level of the laser is limited to a low level such as about 0.9 μJ, and such a limited energy level is in some cases insufficient to surely melt down a desired fuse depending on a situation determined by, for example, the thickness of the insulating film on a fuse.

As described above, with the conventional semiconductor device, in order to melt down a very fine fuse, heat is applied to the fuse through an insulating film. Therefore, a meltdown error of fuse caused by the non-uniformity of the thickness of the insulating film, or other type of meltdown error caused by the propagation of the stress when a fuse is scattered in meltdown, due to the difference in the material of the underlying insulating film, occurs. For example, in the case of a silicon oxide film having a multi-layer insulating film structure, as shown in FIG. 18, with its underlying layer being a TEOS film (tetraethyl ortho silicate) 106 and its overlying layer being an HDP (high density plasma) film 107, as laser energy is irradiated on a melted-down fuse 108, a stress created as the melted-down fuse scatters is propagated between the TEOS film 106 and the HDP film 107 as indicated by an arrow in FIG. 18, thereby causing an adverse effect on an adjacent non-melted fuse 109. Thus, in some cases, the fuse which should not be melted down is wrongly fused depending on a situation. Further, even if it is not fused, the width of wiring of the fuse which should not be melted down, is narrowed due to the adverse effect of the stress caused by the scattering of the fuse, thus increasing its resistance value.

BRIEF SUMMARY OF THE INVENTION

An object of the present invention are to solve the above-described drawback of the prior art technique. More specifically, the object of the invention is to provide a fuse element capable of fusing a very fine fuse uniformly without being influenced by the thickness of the insulating film on the fuse, as well as a method of manufacturing such a fuse element.

Another object of the present invention is to provide a highly integrated fuse element in which an adverse effect on an adjacent fuse element is suppressed by reducing the amount of scattering pieces of a meltdown fuse when it is fused.

In order to achieve the above-described object, there is provided, according to a first aspect of the present invention, a semiconductor device comprising a semiconductor substrate; a first insulating film region provided in a groove-like manner in the semiconductor substrate; a fuse element provided on the first insulating film region; a second insulating film region formed on the fuse element and the first insulating film region; and a metal plug connected to the fuse element, and having a surface exposed to a surface of the second insulating film region.

In the semiconductor device according to the first aspect of the present invention, the metal plug may include a portion projecting on the surface of the second insulating film.

There is further provided, according to a second aspect of the present invention, a semiconductor device comprising a semiconductor substrate; a first insulating film provided on the semiconductor substrate; a first fuse element provided on the first insulating film; a second insulating film formed on the fuse element and the first insulating film, the second insulating film having a via hole formed therein; and a first metal plug formed in the via hole formed in the second insulating film, the metal plug being connected to the fuse element, and having a surface exposed to a surface of the second insulating film.

In the semiconductor device according to the second aspect of the present invention, the surface of the first metal plug may be depressed in the via-hole is removed.

In the semiconductor device according to the second aspect of the present invention, the first metal plug may have a portion projecting on the surface of the second insulating film.

In the semiconductor device according to the second aspect of the present invention, the semiconductor device may further comprise an element separation film formed on the semiconductor substrate, wherein the via hole formed in the second insulating film may be above the element separation film, and the first metal plug may be above the element separation film. The surface of the first metal plug may be depressed in the via-hole is removed. The first metal plug may have a portion projecting on the surface of the second insulating film.

In the semiconductor device according to the second aspect of the present invention, the semiconductor device may further comprise an element separation film formed on the semiconductor substrate, wherein the first insulating film may have an open hole formed therein, a second metal plug may be provided in the open hole formed in the first insulating film, the open hole formed in the first insulating film may be outside of a region of the element insulating film, the via hole formed in the second insulating film may be outside of the region of the element separation film, and the first metal plug formed in the vial hole of the second insulating film may be outside of the region of the element separation film. The surface of the first metal plug may be depressed in the via-hole may be removed. The first metal plug may have a portion projecting on the surface of the second insulating film.

In the semiconductor device according to the second aspect of the present invention, the semiconductor device may further comprise an element separation film formed on the semiconductor substrate, a second fuse element formed on the first insulating film, and a third insulating film provided between the first insulating film and the first fuse element, the third insulating film having an open hole formed therein, a second metal plug provided in the opening hole formed in the third insulating film, wherein the open hole formed in the third insulating film may be above the element insulating film, the second metal plug provided in the opening hole may be above the element insulating film, the via hole formed in the second insulating film may be above the element separation film, and the first metal plug formed in the vial hole of the second insulating film may be above the element separation film. The surface of the first metal plug may be depressed in the via-hole may be removed. The first metal plug may have a portion projecting on the surface of the second insulating film.

With the above-described structures, it becomes possible to carry out meltdown of a fuse without having a non-uniform meltdown of the fuse or erroneous fusing caused by the stress created in the scattering of a melted-down fuse due to the difference in the material of the underlying insulting film. Therefore, with the present invention, a fuse element capable of uniformly melting down a very fine fuse without adversely affected depending on the thickness of the insulating film on the fuse, can be provided.

Further, according to a third aspect of the present invention, there is provided a method of manufacturing a semiconductor device including the steps of: forming an element separation region on a semiconductor substrate; forming a first insulating film on the element separation region; depositing a metal fuse on the first insulating film; depositing a second insulating film on the metal fuse; removing a region of the second insulating film, where a via-hole is to be formed, by etching; depositing a metal film on the second insulating film such as to completely embed the via-hole formation scheduled region; and forming a metal plug by etching a section of the metal film, other than a region where a plug is to be formed. With this structure, a metal plug can be formed on a fuse while reducing the number of processing steps, and further it becomes possible to prepare a fuse of a high controllability, which is not affected by the thickness of the insulating film on the fuse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1B:
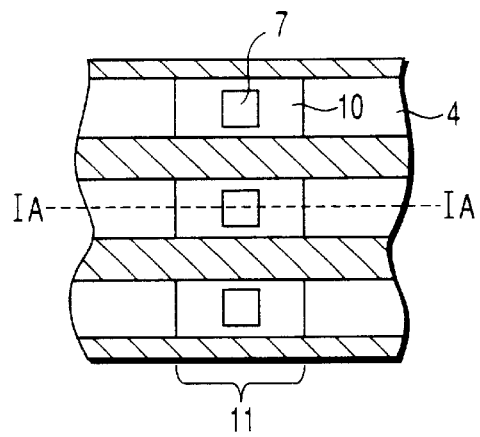
FIG. 1B is a top view of the semiconductor device according to the first embodiment of the present invention.

Embodiments of the present invention will now be described with reference to accompanying drawings. In these drawings and the descriptions therefor, the same or similar structural members are designated by the same or similar reference numerals. It should be noted that the figures are schematic and therefore the relationship between the thickness and the measurements of plane, or the ratio between layers in terms of thickness with respect to each other should differ from practical cases, and therefore specific thickness or measurements should be understood from actual values used in the following descriptions. Further, between figures, there are sections where the relationship or ratio of measurements is different although these sections are of the same structural member.

First Embodiment

Figure 1A:
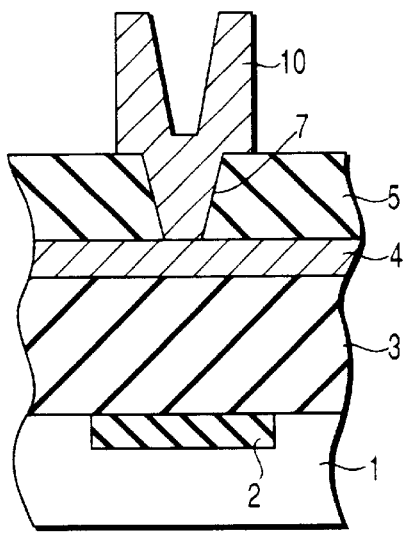
FIG. 1A is a cross sectional view of a semiconductor device according to a first embodiment of the present invention.

A semiconductor device (in this embodiment, it is a fuse element) according to the first embodiment of the present invention is shown in FIGS. 1A and 1B, and will now be described with reference to these figures.

FIG. 1A is a cross sectional view of a fuse element, and FIG. 1B is a top view of the fuse element. A cross sectional view taken along the line IA—IA of FIG. 1B is illustrated as FIG. 1A. FIG. 1B is a figure showing an example in which three fuse elements 4 are formed adjacent and in parallel to each other, for the simplification of the illustration; however in actual cases, several thousands or more fuse films 4 are formed in one region depending on a situation. Here, the width of a fuse element 4 is about 0.6 $\mu$m, and the length (taken in a direction normal to the width) of a meltdown region 11 of the fuse element 4, which is fused with laser, is about 1 $\mu$m. It should be noted here that the fuse element 4, in an actual structure, is an underlying film of the second insulating film 5 as shown in FIG. 1A (in cross section). Therefore, the fuse element cannot originally be visually indicated in FIG. 1B (top view); however for the convenience of description, the second insulating film 5 on the fuse element 4 is omitted from the illustration.

A method of manufacturing a semiconductor device (a fuse element in this embodiment) according to the first embodiment will now be described with reference to FIGS. 2A to 3D.

Figure 2B:
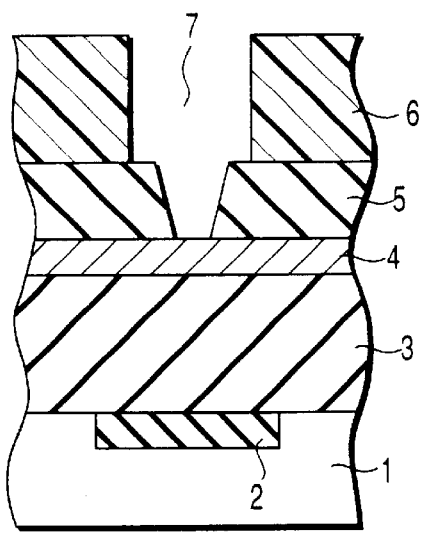
FIGS. 2A to 2C are cross sectional views of a semiconductor structure in each processing step of a method of manufacturing the semiconductor device according to the first embodiment of the present invention, shown in FIGS. 1A and 1B.
Figure 2A:
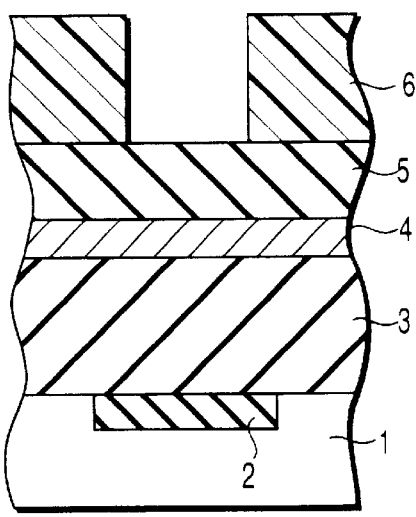

In a step shown in FIG. 2A, first, an element separation region 2 is formed on a semiconductor substrate 1, and then a first insulating film 3 made of a silicon oxide film is deposited thereon to have a film thickness of, for example, 1.4 $\mu$m. Next, a metal fuse film 4 made of, for example, aluminum is deposited on the first insulating film 3 to have a film thickness of, for example, 2000 to 3000 angstroms. After that, a second insulating film 5 made of a silicon oxide film is deposited on the metal fuse film 4 to have a film thickness of, for example, 5000 angstroms. Subsequently, a photoresist 6 is applied on the second insulating film 5, and the applied photoresist is patterned. In this manner, a photoresist 6 of a pattern having an opening for forming a via-hole on a region of the second insulating film, in which a via-hole is to be formed, is formed.

Next, in a step shown in FIG. 2B, the via-hole formation schedule region of the second insulating film 5 is removed by anisotropic etching, for example, dry etching, with use of the photoresist 6 as a mask, so as to form a hole pattern 7 for the formation of a via-hole. Here, the length of the bottom portion of the hole pattern is, for example, about 0.3 to 0.5 $\mu$m.

Figure 2C:
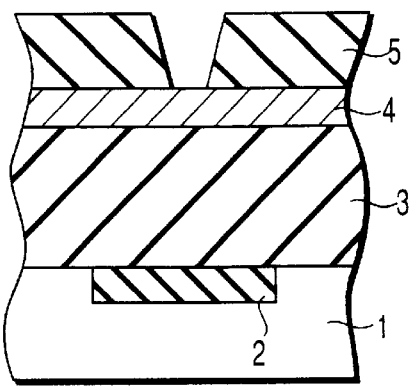

After that, in a step shown in FIG. 2C, the photoresist 6 is removed by an ashing process.

Figure 3A:
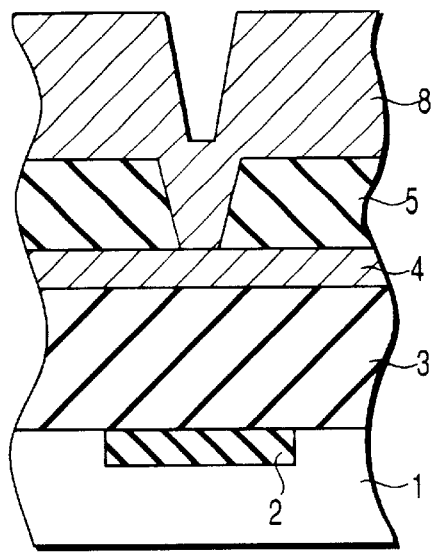
FIGS. 3A to 3D are cross sectional views of a semiconductor structure in each processing step of a method of manufacturing the semiconductor device according to the first embodiment of the present invention, shown in FIGS. 1A and 1B.

Next, in a step shown in FIG. 3A, a metal film 8 made of, for example, aluminum is formed to have a thickness of about 1 $\mu$m on the second insulating film 5, so as to complete fill the hole pattern 7 with the metal film 8. That the metal film 8 in the hole pattern 7 is shaped such that the surface thereof is depressed by the depth of the hole pattern 7.

Figure 3B:
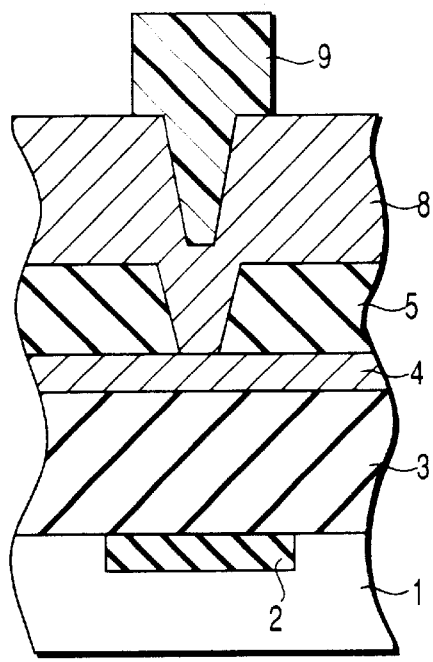

Next, in a step shown in FIG. 3B, a photoresist is applied on the metal film 8, and the applied photoresist is patterned by lithography. In this manner, a photoresist 9 of a pattern for forming a plug on a region of the metal film 8, in which the metal plug is to be formed, is formed.

Figure 3C:
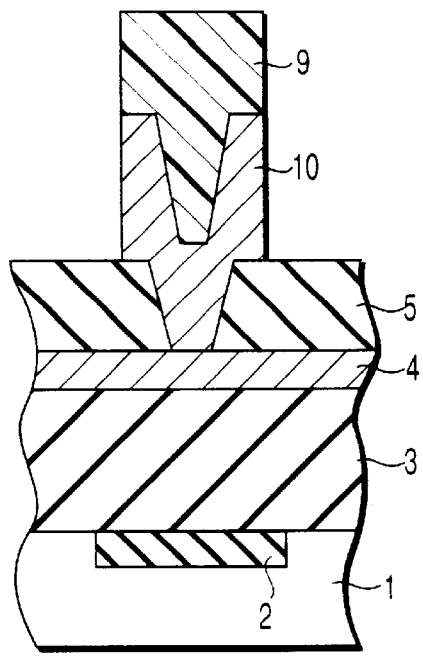
Figure 3D:
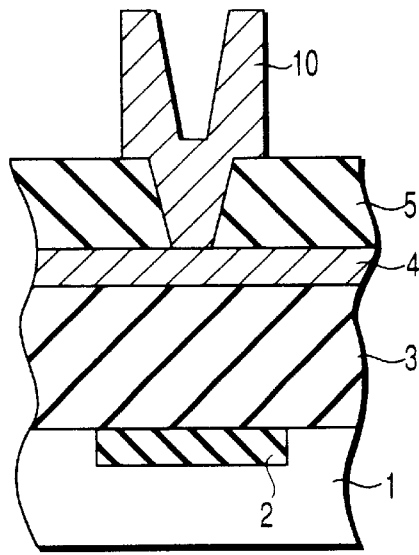

Next, in a step shown in FIG. 3C, the section of the metal film 8 other than the metal plug formation schedule region is removed by isotropic etching, for example, wet etching, with use of the photoresist 9 as a mask. Thus, a fuse element having a structure shown in FIG. 3D, is formed. That is, a fuse element of this embodiment, in which the metal plug 10 is formed on the second insulating film 5, such as shown in FIGS. 1A and 1B, is formed.

With thus obtained fuse, the fusing of a fuse necessary in heat breakdown is carried out by laser. Thus, in this embodiment, the area of the fusing region is reduced as compared to the conventional case, thereby making it possible to improve a higher density of the fuse region. Here, since the metal plug 10 is formed on the fuse 4, the stress of the melted-down fuse is released from the metal plug 10. Therefore, the stress of the fuse created by the scattering of the fuse material caused by fusing is relaxed, and thus erroneous fusing of an adjacent fuse can be prevented. For this reason, while the control of the thickness of the second insulating film 5 formed on the fuse 4 is not necessary, the breakdown of the fuse can be effectively can be performed. Further, since a laser beam is irradiated directly on the metal plug, the stress can be relaxed. Therefore, an high energy level of about 1 $\mu$J can be used, and with this energy level, it is possible to surely melt down a desired fuse.

Further, in this embodiment, the metal plug on a fuse can be formed at the same time as in a step of forming a metal film of a connection pad of a semiconductor element. Therefore, one step of the conventional technique, which is for etching the insulating film on the fuse to a desired thickness, becomes unnecessary, and thus the number of steps can be reduced. That is, in this embodiment, the metal plug can be formed on a fuse while reducing the number of steps. Thus, a fuse with a high controllability, which is not affected by the thickness of the insulating film on the fuse, can be formed.

Further, with this embodiment, the breakdown rate of the fuse is improved, and therefore the pitch of fuses is narrowed, the yield of products can be improved.

It should be noted that in this embodiment, the first insulating film 3 and the second insulating film 5 are described each as a single insulating film; however an insulating film of a multi-layer can be used as well.

Figure 4:
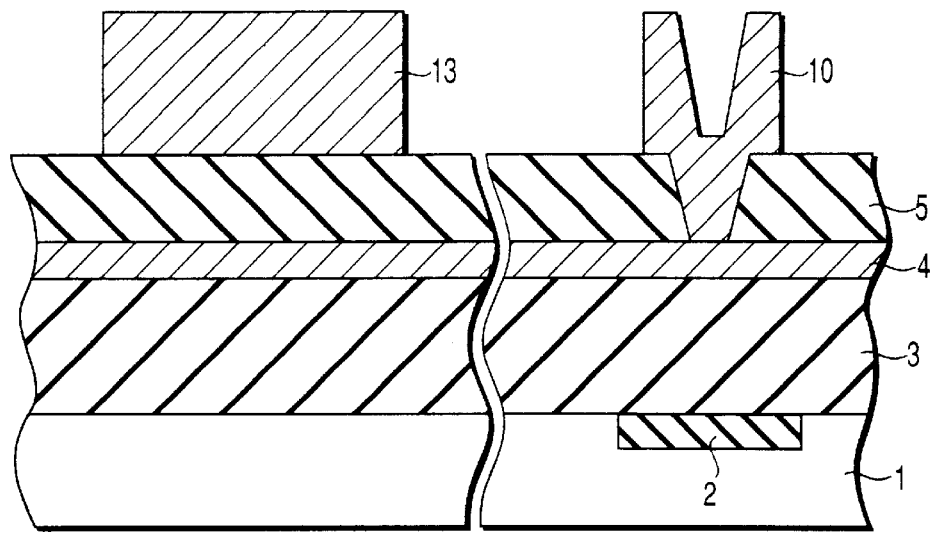
FIG. 4 is a cross sectional view of a semiconductor device in which a semiconductor structure according to the first embodiment of the present invention is applied.

Furthermore, the metal plug 10 in the fuse region is formed on the fuse 4, and therefore the metal plug can be formed at the same time as in a step of forming a pad 13 of a semiconductor chip of a semiconductor device shown in FIG. 4. In other words, the pad 13 and the metal plug 10 are situated on the same plane, and therefore they can be deposited at the same time, and also etched at the same time. For this reason, as compared to the conventional method of manufacturing a fuse, the manufacturing method described above in connection with FIGS. 2A to 3D has an effect of shortening the processing step. Here, the pad is an input/output terminal through which an input/output signal, power potential and the like are supplied when the semiconductor chip is set on a circuit board or the like. It should be noted that FIG. 4 illustrates a cross section of an example of the semiconductor device comprising a fuse element shown in FIGS. 1A and 1B.

Second Embodiment

Figure 5A:
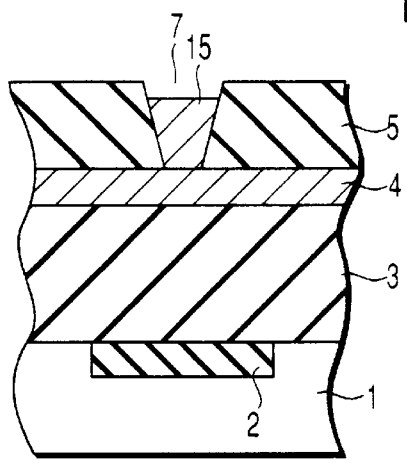
FIG. 5A is a cross sectional view of a semiconductor device according to a second embodiment of the present invention is applied.
Figure 5B:
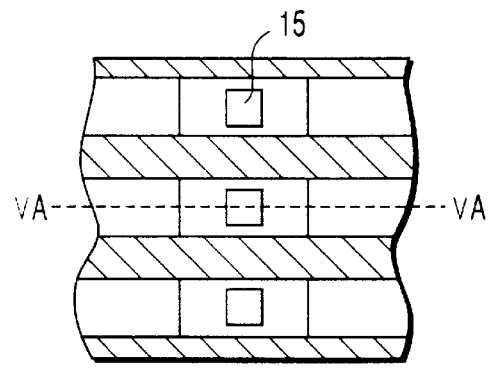
FIG. 5B is a top view of the semiconductor device according to the second embodiment of the present invention is applied.

A semiconductor device (in this embodiment, it is a fuse element) according to the second embodiment of the present invention is shown in FIGS. 5A and 5B, and will now be described with reference to these figures.

FIG. 5A is a cross sectional view of a fuse element, and FIG. 5B is a top view of the fuse element. A cross sectional view taken along the line VA—VA of FIG. 5B is illustrated as FIG. 5A. FIG. 5B is a figure showing an example in which three fuse elements 4 are formed adjacent and in parallel to each other, for the simplification of the illustration; however in actual cases, several thousands or more fuse films 4 are formed in one region depending on a situation. Here, the width of a fuse element 4 is about 0.6 $\mu$m, and the length (taken in a direction normal to the width) of a meltdown region 11 of the fuse element 4, which is fused with laser, is about 1 $\mu$m. It should be noted here that the fuse element 4, in an actual structure, is an underlying film of the second insulating film 5 as shown in FIG. 5A (in cross section). Therefore, the fuse element cannot originally be visually indicated in FIG. 5B (top view); however for the convenience of description, the second insulating film 5 on the fuse element 4 is omitted from the illustration.

In the semiconductor device according to the second embodiment shown in FIGS. 5A and 5B, a metal plug 15 is formed only in a via-hole 7. The metal plug 15 is formed by removing the portion of the metal film 8 on the surface of the via-hole 7, so that and it remains from the bottom portion of the via-hole to a certain thickness. The second embodiment is different from the first embodiment only in this aspect, and the other structure is similar to that of the first embodiment. With such a shape that the metal plug 15 on the fuse is allowed to remain only in the via-hole 7, it becomes possible to reduce the amount of scattering pieces of fuse in the breakdown of the fuse, and therefore the adverse effect on an adjacent fuse can be suppressed, in addition to the advantage achieved by the first embodiment.

In the method of manufacturing a semiconductor device according to the first embodiment, the photoresist 9 used as a mask is formed on the metal layer 8 in the step shown in FIG. 3B, and then the metal film 8 is patterned with use of the photoresist 6 as a mask in the step shown in FIG. 3B. However, in the method of manufacturing a semiconductor device according to the second embodiment, the photoresist 9 used as a mask on the metal film 8 is not formed. In place, the metal film on the surface of the second insulating film 5 is completely removed by dry etching, and the metal layer in the via-hole 7 is allowed to remain to a certain thickness by removing only the portion on the surface of the via-hole 7. The other steps are similar to those of the first embodiment. It should be noted that the first insulating film 3 is described to be a single layer; however it may be of a multi-layered structure made of a plurality of insulating films, to realize the embodiment.

Here, a method of manufacturing a semiconductor device (a fuse element in this embodiment) according to the second embodiment will now be described with reference to FIGS. 6A to 7B.

Figure 6A:
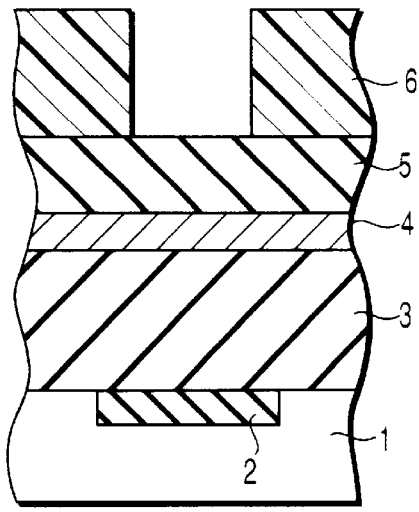
FIGS. 6A to 6C are cross sectional views of a semiconductor structure in each processing step of a method of manufacturing the semiconductor device according to the second embodiment of the present invention, shown in FIGS. 5A and 5B.

In a step shown in FIG. 6A, first, an element separation region 2 is formed on a semiconductor substrate 1, and then a first insulating film 3 made of a silicon oxide film is deposited thereon to have a film thickness of, for example, 1.4 $\mu$m. Next, a metal fuse film 4 made of, for example, aluminum is deposited on the first insulating film 3 to have a film thickness of, for example, 2000 to 3000 angstroms. After that, a second insulating film 5 made of a silicon oxide film is deposited on the metal fuse film 4 to have a film thickness of, for example, 5000 angstroms. Subsequently, a photoresist 6 is applied on the second insulating film 5, and the applied photoresist is patterned by lithography. In this manner, a photoresist 6 of a pattern having an opening for forming a via-hole on a region of the second insulating film, in which a via-hole is to be formed, is formed.

Figure 6B:
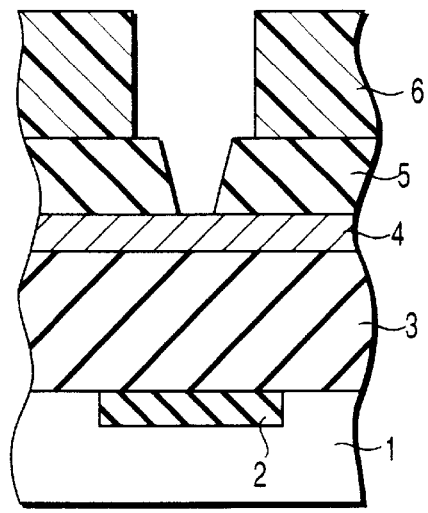

Next, in a step shown in FIG. 6B, the via-hole formation schedule region of the second insulating film 5 is removed by anisotropic etching, for example, dry etching, with use of the photoresist 6 as a mask, so as to form a hole pattern 7 for the formation of a via-hole. Here, the length of the bottom portion of the hole pattern 7 is, for example, about 0.3 to 0.5 μm.

Figure 6C:
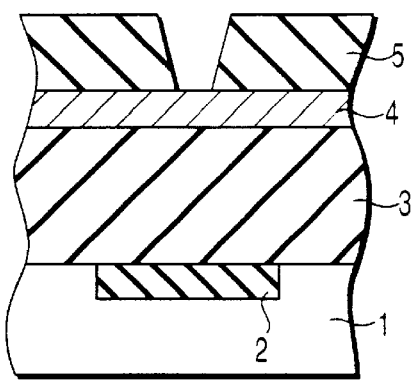

After that, in a step shown in FIG. 6C, the photoresist 6 is removed by an ashing process.

Figure 7A:
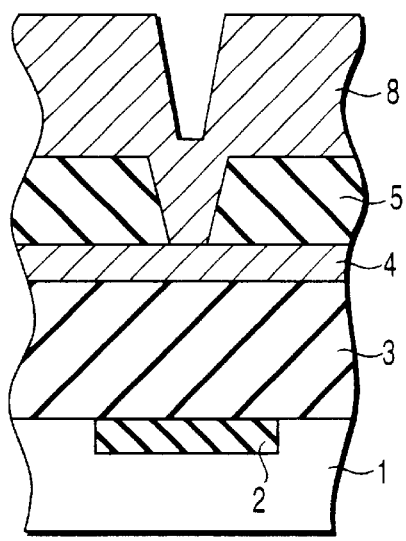
FIGS. 7A and 7B are cross sectional views of a semiconductor structure in each processing step of a method of manufacturing the semiconductor device according to the second embodiment of the present invention, shown in FIGS. 5A and 5B.

Next, in a step shown in FIG. 7A, a metal film 8 made of, for example, aluminum is formed to have a thickness of about 1 μm on the second insulating film 5, so as to completely fill the hole pattern 7 with the metal film 8. The metal film 8 on the hole pattern 7 is shaped such that the surface thereof is depressed by the depth of the hole pattern 7.

Figure 7B:
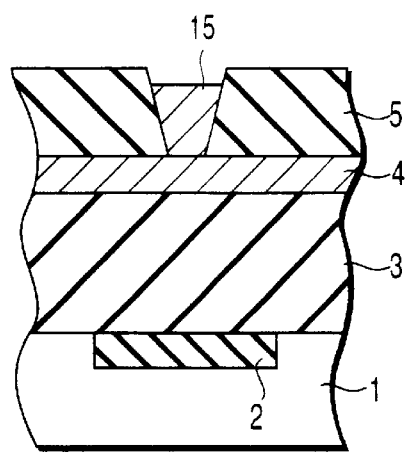

Next, in a step shown in FIG. 7B, the portion of the metal film 8 other than the metal plug formation schedule region is removed by dry etching. The portion of the metal film 8 on the surface of the via-hole 7 is removed, and it remains from the bottom portion of the via-hole to a certain thickness. Thus, a fuse element having a structure according to this embodiment is formed. That is, a fuse element as shown in FIGS. 5A and 5B, is formed.

Third Embodiment

Figure 8:
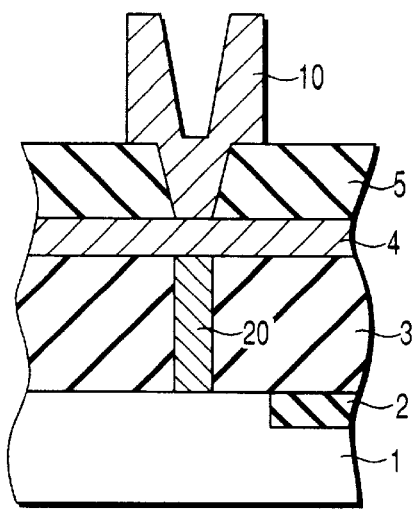
FIG. 8 is a cross sectional view of a semiconductor device according to a third embodiment of the present invention is applied.

A semiconductor device (a fuse element in this embodiment) according to the third embodiment of the present invention is shown in FIG. 8. FIG. 8 is a cross sectional view of the fuse element.

Now, the semiconductor device of the third embodiment of the present invention will be described with reference to FIG. 8.

In the semiconductor device according to the third embodiment shown in FIG. 6, an opening is made in a first insulating film 3 on a semiconductor substrate 1, and a second metal plug 20 is formed within the opening. The opening is made on a region of the semiconductor substrate 1, where an element separation region 2 is not formed. In other words, the opening is located on the element region of the semiconductor substrate 1. Therefore, the opening is communicated to the element region of the semiconductor substrate 1. With this structure, the fuse is connected to the element region of the semiconductor substrate 1 via the second metal plug 20. Further, in the third embodiment, the metal plug 10 on the fuse is formed not above the element separation region 2, but above the element region of the semiconductor substrate 1. This embodiment is different from the first embodiment in these aspects, and the other structure is similar to that of the first embodiment. It should be noted here that the first insulating film 3 is illustrated as a single layer structure in this embodiment, but it can be realized with a multi-layered structure consisting of a plurality of insulating films.

In the third embodiment, the fuse is connected to the element region of the semiconductor substrate 1 via the second metal plug 20, and therefore the potential of the substrate 1 and that of the fuse can be equalized as an advantage. Further, in the third embodiment, the metal plug 10 on the fuse is formed above the element region of the semiconductor substrate 1, and therefore the semiconductor substrate 1 and the fuse can be set at the same potential level. In particular, when the semiconductor substrate 1 is set at the ground potential level, and fuses provided in a plurality of numbers, are connected to the semiconductor substrate, these plurality number of fuses can be all set to the same potential.

In the method of manufacturing a semiconductor device according to the third embodiment, prior to the step shown in FIG. 2A in the semiconductor device manufacturing step of the first embodiment, an opening is made in the first insulating film 3 on the semiconductor substrate 1. It should be noted that the opening is made on a region of the semiconductor substrate 1, where the element separation region 2 is not formed. That is, the opening is situated on the element region of the semiconductor substrate 1. With this structure, the opening is communicated with the element region of the semiconductor substrate 1. Further, a metal film is deposited thickly on the first insulating film 3 so as to embed the opening. After that, the portion of the deposited metal film which is located on the above surface of the first insulating film, is removed so as to allow the deposited metal film remain only in the opening. In this manner, the second metal plug 20 is formed in the opening. Subsequently, a fuse 4 is formed on the first insulating film 3. The processing steps from this onwards, are similar to those of the first embodiment. It should be noted here that in the third embodiment, the metal plug 10 on the fuse is formed not above the element separation region 2, but above the element region of the semiconductor substrate 1.

Here, a method of manufacturing a semiconductor device (a fuse element in this embodiment) according to the third embodiment will now be described in detail with reference to FIGS. 9A to 11D.

Figure 9A:
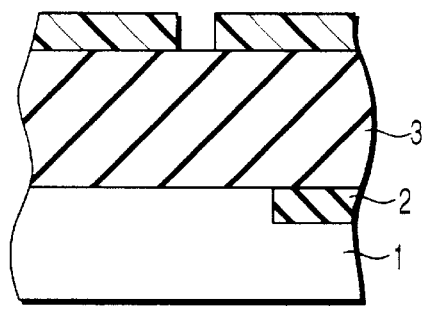
FIGS. 9A to 9D are cross sectional views of a semiconductor structure in each processing step of a method of manufacturing the semiconductor device according to the third embodiment of the present invention, shown in FIG. 8.

In a step shown in FIG. 9A, first, an element separation region 2 is formed on a semiconductor substrate 1, and then a first insulating film 3 made of a silicon oxide film is deposited thereon to have a film thickness of, for example, 1.4 μm. Next, a photoresist is applied on the first insulating film 3, and the applied photoresist is patterned by lithography. In this manner, a photoresist of a pattern having an opening on a region of the second insulating film is formed. Thus, the opening of the photoresist pattern is situated on the region other than the element separation region 2.

Figure 9B:
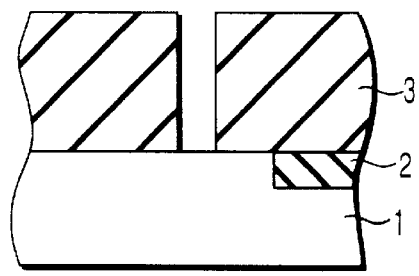

Next, in a step shown in FIG. 9B, the opening formation schedule region of the first insulating film 3 is removed by anisotropic etching, for example, dry etching, with use of the photoresist as a mask, so as to form an opening in the first insulating film 3. The opening the photoresist pattern is situated above the region other than the element separation region 2, and therefore the opening formed in the first insulating film 3 is naturally situated above the region other than the element separation region 2. After that, the photoresist 6 is removed by an ashing process.

Figure 9C:
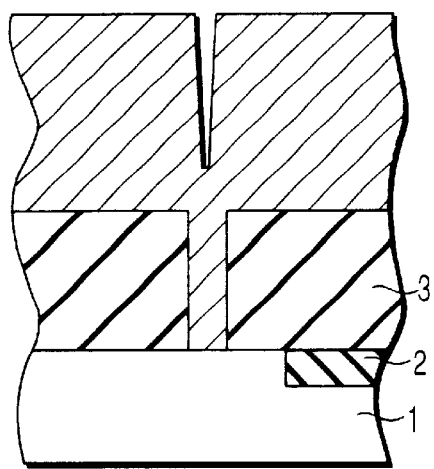

Next, in a step shown in FIG. 9C, a metal film made of, for example, aluminum is formed on the first insulating film 3, to have such a thickness as to completely fill the opening formed in the first insulating film 3.

Figure 9D:
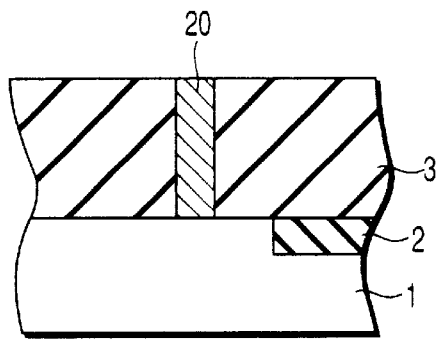

After that, in the step shown in FIG. 9D, the portion of the metal film, which is situated on the surface of the first insulating film 3 is removed by dry etching, so as to allow the portion of the metal film to remain only in the opening of the first insulating film 3.

Figure 10A:
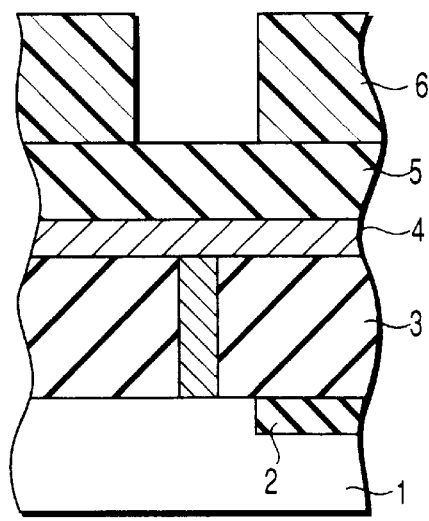
FIGS. 10A to 10C are cross sectional views of a semiconductor structure in each processing step of a method of manufacturing the semiconductor device according to the third embodiment of the present invention, shown in FIG. 8.

In a step shown in FIG. 10A, a metal fuse film 4 made of, for example, aluminum is deposited on the first insulating film 3 to have a film thickness of, for example, 2000 to 3000 angstroms. After that, a second insulating film 5 made of a silicon oxide film is deposited on the metal fuse film 4 to have a film thickness of, for example, 5000 angstroms. Subsequently, a photoresist 6 is applied on the second insulating film 5, and the applied photoresist is patterned by lithography. In this manner, a photoresist 6 of a pattern having an opening on a region of the second insulating film is formed.

Figure 10B:
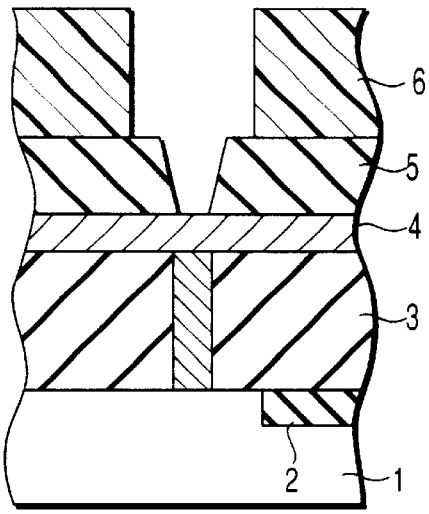

Next, in a step shown in FIG. 10B, the via-contact formation schedule region of the second insulating film 5 is removed by anisotropic etching, for example, dry etching, with use of the photoresist 6 as a mask, so as to form a hole pattern 7 for the formation of a via-contact. Here, the length of the bottom portion of the hole pattern is, for example, about 0.3 to 0.5 $\mu$m.

Figure 10C:
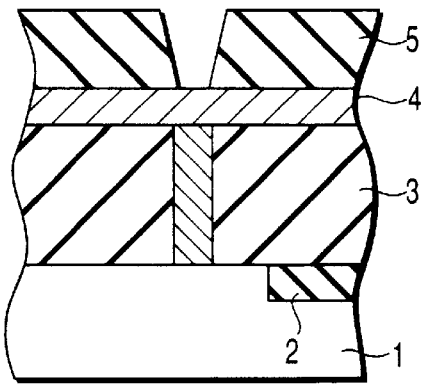

After that, in a step shown in FIG. 10C, the photoresist 6 is removed by an ashing process.

Figure 11A:
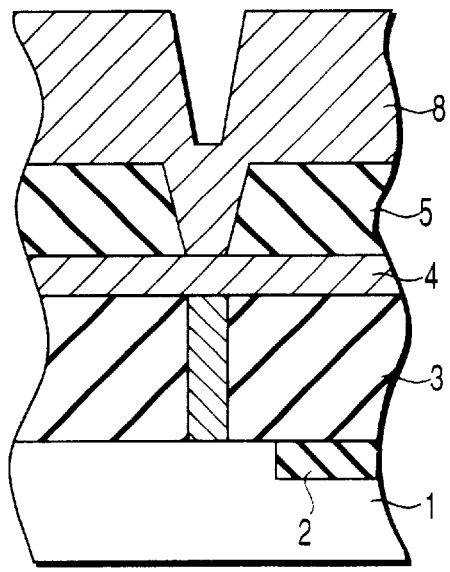
FIGS. 11A to 11D are cross sectional views of a semiconductor structure in each processing step of a method of manufacturing the semiconductor device according to the third embodiment of the present invention, shown in FIG. 8.

Next, in a step shown in FIG. 11A, a metal film 8 made of, for example, aluminum is formed to have a thickness of about 1 $\mu$m on the second insulating film 5, so as to completely fill the hole pattern 7 with the metal film 8. The metal film 8 on the hole pattern 7 is shaped such that the surface thereof is depressed by the depth of the hole pattern 7.

Figure 11B:
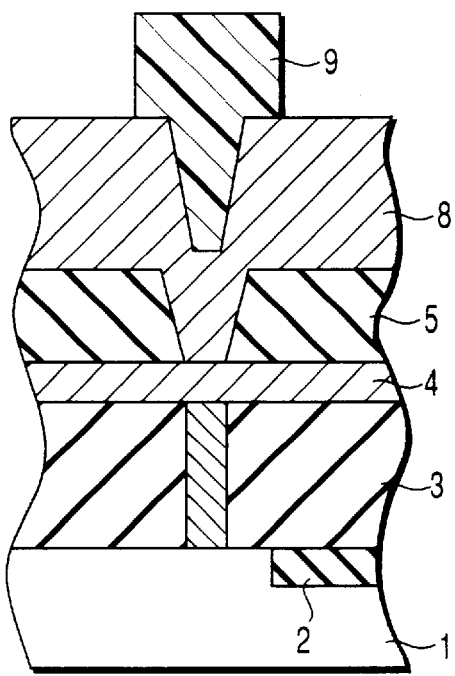

Subsequently, in a step shown in FIG. 11B, a photoresist is applied on the metal film 8, and the applied photoresist is patterned by lithography. In this manner, a photoresist pattern 9 is formed on a region of the metal film 8, in which a metal plug is to be formed.

Figure 11C:
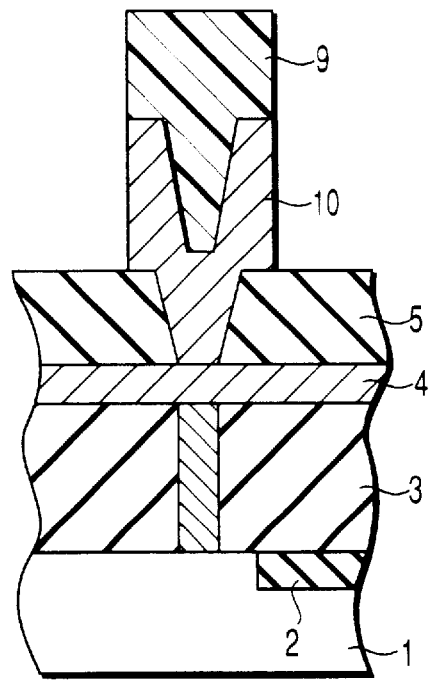
Figure 11D:
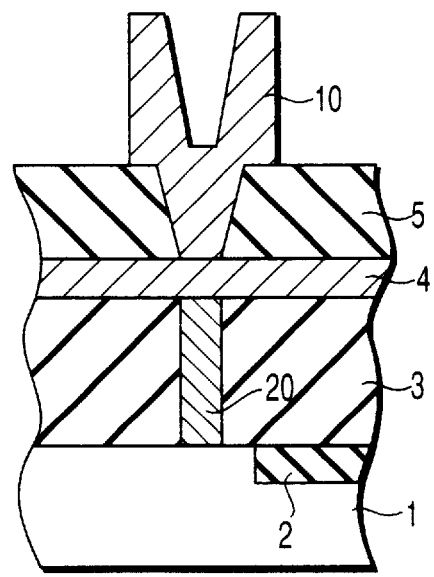

Next, in a step shown in FIG. 11C, the section of the metal film 8 other than the metal plug formation schedule region is removed by, for example, dry etching, with use of the photoresist 9 as a mask. Thus, a fuse element having a structure shown in FIG. 11D is formed. In other words, a fuse element of this embodiment is formed.

Fourth Embodiment

Figure 12:
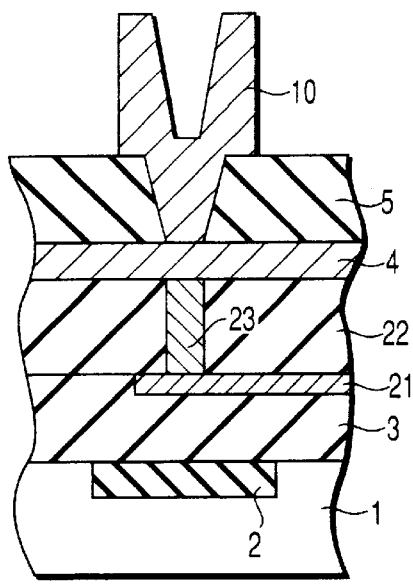
FIG. 12 is a cross sectional view of a semiconductor device according to the fourth embodiment of the present invention is applied.

A semiconductor device (a fuse element in this embodiment) according to a fourth embodiment of the present invention is shown in FIG. 12. FIG. 12 is a cross sectional view of the fuse element.

Now, the semiconductor device of the fourth embodiment of the present invention will be described with reference to FIG. 12.

In the semiconductor device according to the fourth embodiment shown in FIG. 12, a first insulating film 3 is formed on a semiconductor substrate 1, and a part of a surface region of the first insulating film 3, which is located on an element separation region 2 is etched to made a groove section. The groove section is filled with a material such as tungsten or polyimide, and thus a second fuse 21 is formed. Further, a third insulating film 22 is deposited on a portion of the first insulating film 3, where the second fuse 21 is formed. An opening is made in the third insulating film 22, and a second metal plug 23 is formed within the opening. Then, a fuse is formed on a portion of the third insulating film 22 where the metal plug 23 is formed. This embodiment is different from the first embodiment in these aspects, and the other structure is similar to that of the first embodiment. It should be noted here that the first insulating film 3 and the third insulating film are illustrated as a single layer structure in this embodiment, but each of them can be realized with a multi-layered structure consisting of a plurality of insulating films.

In the fourth embodiment, the second fuse is newly provided in addition to the first fuse, and therefore when the potential of the first fuse is set to the same potential as that of the second fuse, the potential of the first fuse can be further stabilized.

In the method of manufacturing a semiconductor device according to the fourth embodiment, prior to the step shown in FIG. 2A in the semiconductor device manufacturing step of the first embodiment, a part of a surface region of the first insulating film 3 formed on the semiconductor substrate 1, which is located on the element separation region 2 is etched to made a groove section. The groove section is filled with a material such as tungsten or polyimide, and thus the second fuse 21 is formed. Further, the third insulating film 22 is deposited on the portion of the first insulating film 3, where the second fuse 21 is formed. An opening is made in the third insulating film 22, and a metal film is deposited thickly on the third insulating film 22 so as to embed the opening. After that, the portion of the deposited metal film which is located on the above surface of the third insulating film 22, is removed so as to allow the deposited metal film remain only in the opening. In this manner, the second metal plug 23 is formed in the opening. Subsequently, a fuse 4 is formed on the third insulating film 22. The processing steps from this onwards, are similar to those of the first embodiment.

Here, a method of manufacturing a semiconductor device (a fuse element in this embodiment) according to the fourth embodiment will now be described in detail with reference to FIGS. 13A to 16D.

Figure 13D:
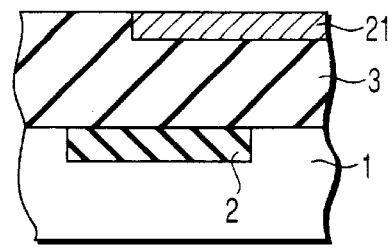
FIGS. 13A to 13D are cross sectional views of a semiconductor structure in each processing step of a method of manufacturing the semiconductor device according to the fourth embodiment of the present invention, shown in FIG. 12.
Figure 13A:
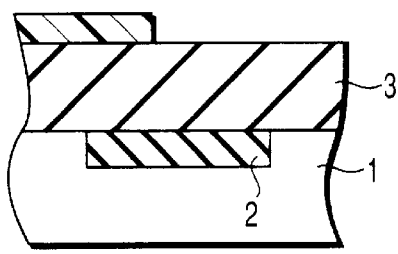

In a step shown in FIG. 13A, first, an element separation region 2 is formed on a semiconductor substrate 1, and then a first insulating film 3 made of a silicon oxide film is deposited thereon to have a film thickness of, for example, 1.4 $\mu$m. Next, a photoresist is applied on the first insulating film 3, and the applied photoresist is patterned by lithography. In this manner, a photoresist of a pattern having an opening, is formed.

Figure 13B:
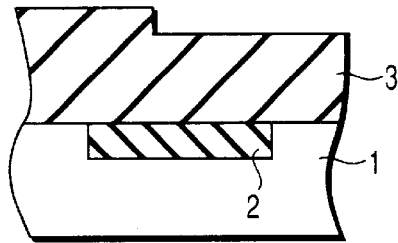

Next, in a step shown in FIG. 13B, a part of the surface region of the first insulating film 3 is removed by anisotropic etching, for example, dry etching, with use of the photoresist as a mask, so as to make a groove in the part of the surface region of the first insulating film 3. After that, the photoresist is removed by an ashing process.

Figure 13C:
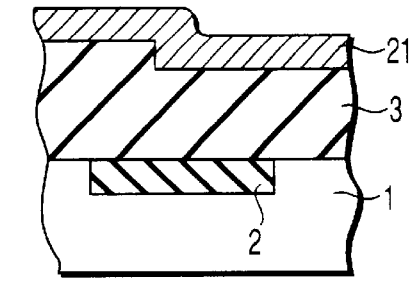

Next, in a step shown in FIG. 13C, a metal fuse film made of, for example, aluminum is formed on the first insulating film 3, to have such a thickness as to completely fill the groove made in the first insulating film 3. After that, in the step shown in FIG. 13D, the portion of the metal film, which is situated on the upper surface of the first insulating film 3 is removed by dry etching, so as to allow the portion of the metal fuse film to remain only in the groove. In this manner, a metal fuse 21 is formed in the groove.

Figure 14A:
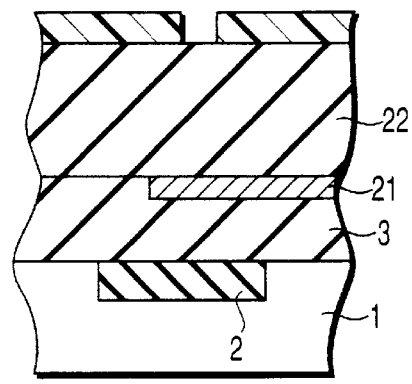
FIGS. 14A to 14D are cross sectional views of a semiconductor structure in each processing step of a method of manufacturing the semiconductor device according to the fourth embodiment of the present invention, shown in FIG. 12.

In a step shown in FIG. 14A, a third insulating film 33 is deposited on the first insulating film 3 in which the second fuse 21 is formed. Then, a photoresist is applied on the third insulating film 22, and the applied photoresist is patterned by lithography. In this manner, a photoresist of a pattern is formed on a region of the third insulating film 22, in which a second metal plug 20 is to be formed.

Figure 14B:
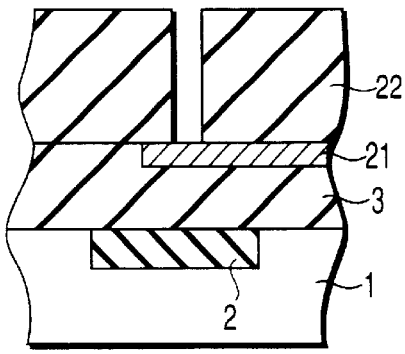

Next, in a step shown in FIG. 14B, a via-contact formation schedule region of the third insulating film 22 is removed by anisotropic etching, for example, dry etching, with use of the photoresist as a mask, so as to form an opening in the third insulating film 22. After that, the photoresist is removed by an ashing process.

Figure 14C:
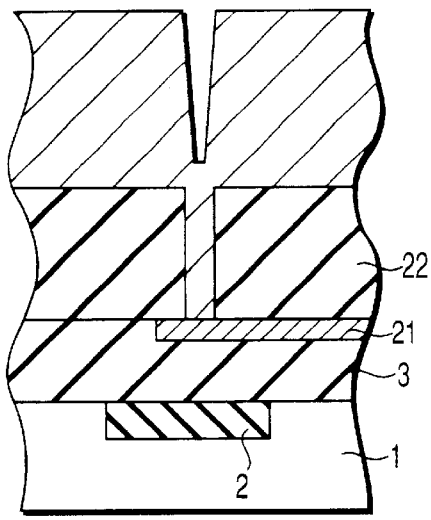

Next, in a step shown in FIG. 14C, a metal film made of, for example, aluminum is deposited on the third insulating film 22, to have such a thickness as to completely fill the opening formed in the third insulating film 22.

Figure 14D:
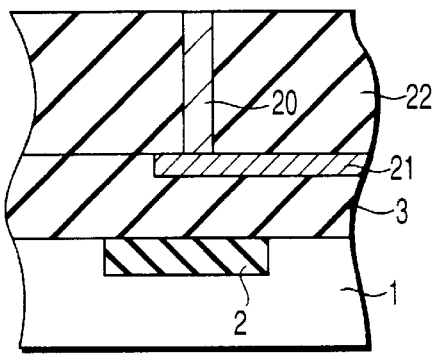

After that, in a step shown in FIG. 14D, the portion of the metal film, which is formed on the surface of the third insulating film 22 is removed by dry etching, so as to allow the metal film to remain only in the opening. In this manner, a second metal plug 20 is formed in the opening.

Figure 15B:
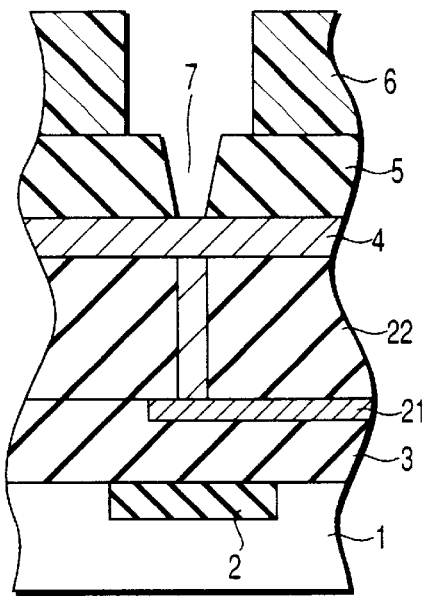
FIGS. 15A to 15C are cross sectional views of a semiconductor structure in each processing step of a method of manufacturing the semiconductor device according to the fourth embodiment of the present invention, shown in FIG. 12.
Figure 15A:
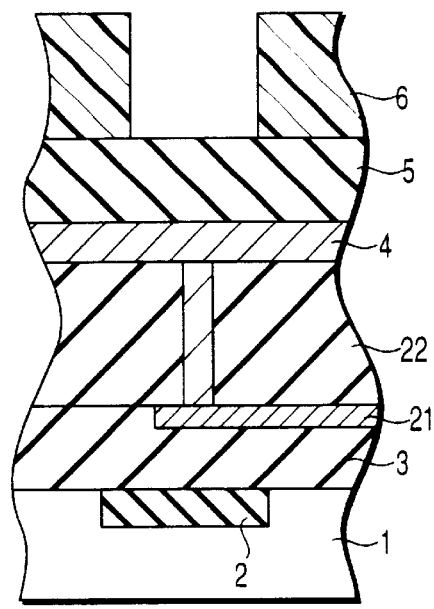

In a step shown in FIG. 15A, a metal fuse film 4 made of, for example, aluminum is deposited on the third insulating film 22 in which the second metal plug 20 is formed, to have a film thickness of, for example, 2000 to 3000 angstroms. After that, a second insulating film 5 made of a silicon oxide film is deposited on the metal fuse film 4 to have a film thickness of, for example, 5000 angstroms. Subsequently, a photoresist 6 is applied on the second insulating film 5, and the applied photoresist is patterned by lithography. In this manner, a photoresist 6 of a pattern having an opening is formed on a region of the second insulating film, in which a via-hole is to be formed.

Next, in a step shown in FIG. 15B, the via-contact formation schedule region of the second insulating film 5 is removed by anisotropic etching, for example, dry etching, with use of the photoresist 6 as a mask, so as to form a hole pattern 7 for the formation of a via-contact. Here, the length of the bottom portion of the hole pattern is, for example, about 0.3 to 0.5 μm.

Figure 15C:
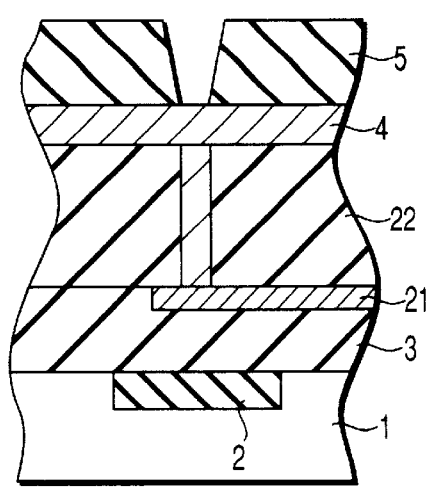

After that, in a step shown in FIG. 15C, the photoresist 6 is removed by an ashing process.

Figure 16A:
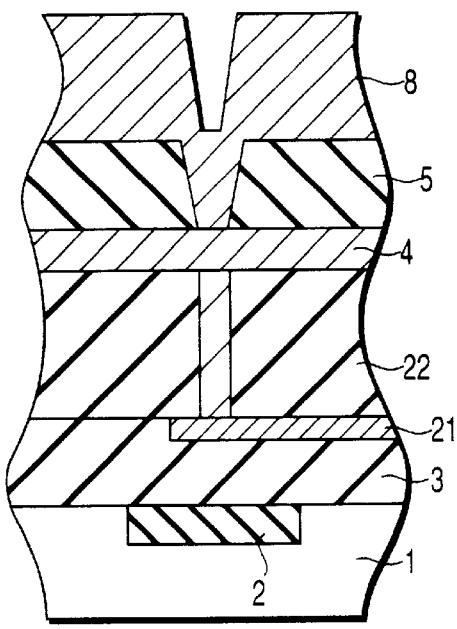
FIGS. 16A to 16D are cross sectional views of a semiconductor structure in each processing step of a method of manufacturing the semiconductor device according to the fourth embodiment of the present invention, shown in FIG. 12.

Next, in a step shown in FIG. 16A, a metal film 8 made of, for example, aluminum is formed to have a thickness of about 1 μm on the second insulating film 5, so as to completely fill the hole pattern 7 with the metal film 8. The metal film 8 on the hole pattern 7 is shaped such that the surface thereof is depressed by the depth of the hole pattern 7.

Subsequently, in a step shown in FIG. 16B, a photoresist is applied on the metal film 8, and the applied photoresist is patterned by lithography. In this manner, a photoresist 9 of a pattern is prepared on a region of the metal film 8, in which a metal plug is to be formed.

Figure 16C:
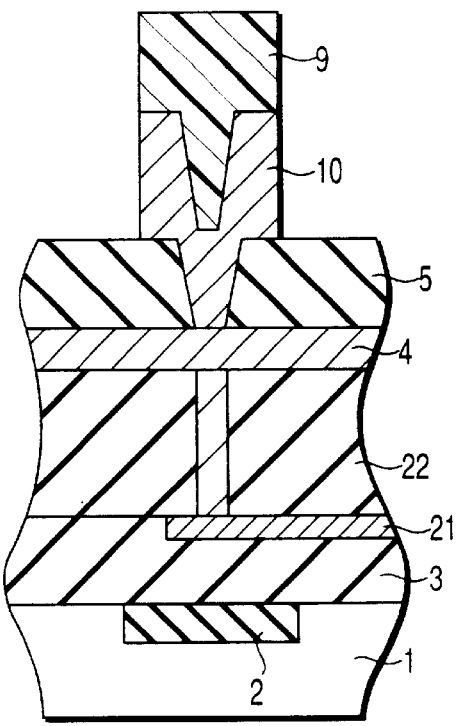
Figure 16B:
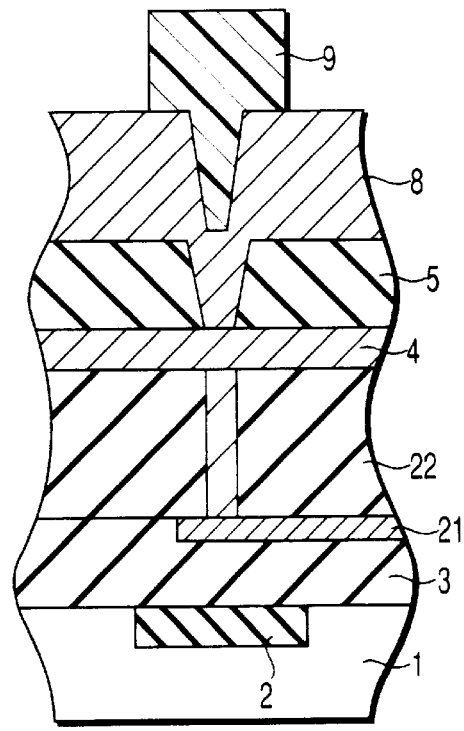
Figure 16D:
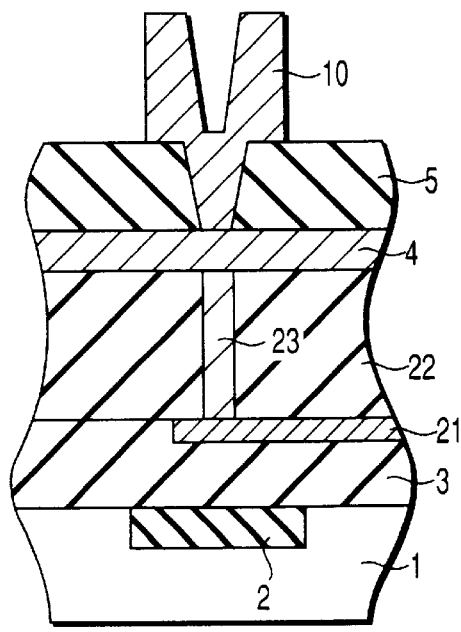
Figure 17A:
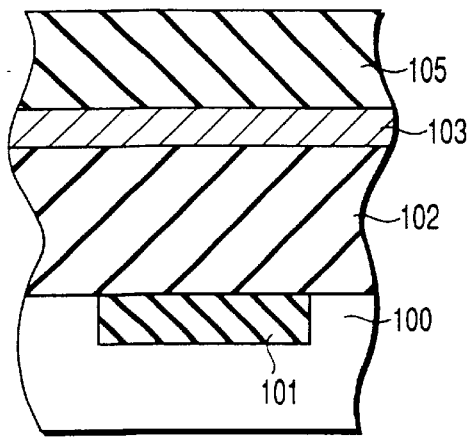
FIG. 17A is a cross sectional view of a conventional semiconductor device.
Figure 17B:
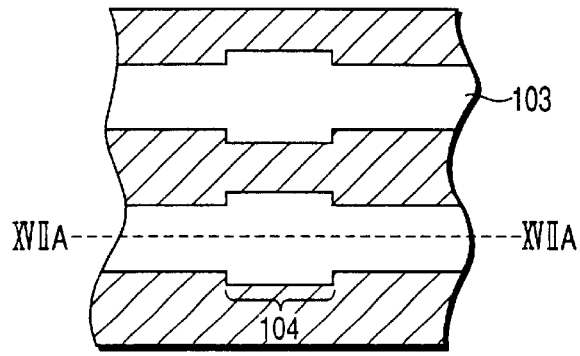
FIG. 17B is a plan view of the conventional semiconductor device.
Figure 18:
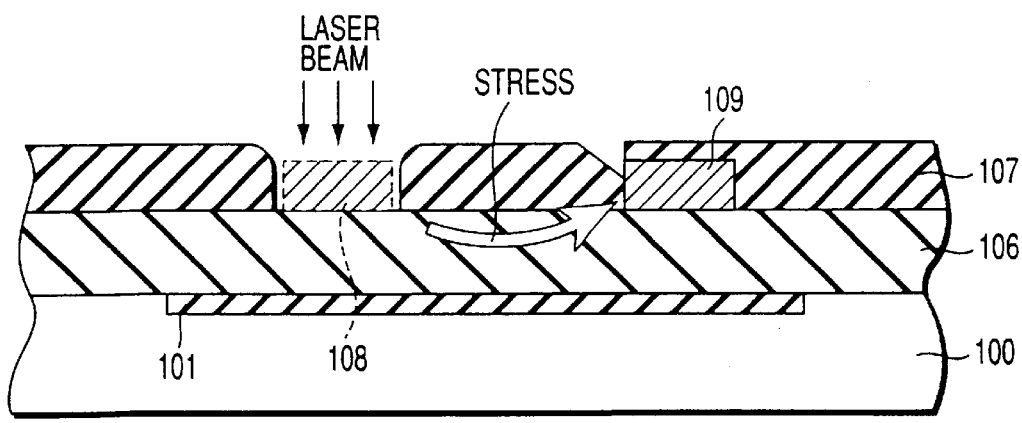
FIG. 18 is a cross sectional view illustrating a drawback of the conventional semiconductor device.

Next, in a step shown in FIG. 16C, the section of the metal film 8 other than the metal plug formation schedule region is removed by anisotropic etching, for example, dry etching, with use of the photoresist 6 as a mask. Thus, a fuse element having a structure shown in FIG. 16D is formed. In other words, a fuse element of this embodiment, as shown in FIG. 12, is formed.

According to the present invention, the metal plug is formed on a fuse, and therefore the stress of the melted-down fuse is released from the metal plug. Consequently, the stress of the fuse created by the scattering of the fuse material caused by fusing is relaxed, and thus erroneous fusing of an adjacent fuse can be prevented. For this reason, while the control of the thickness of the second insulating film formed on the fuse is not necessary, the breakdown of the fuse can be effectively can be performed. Further, the etching step which is essential to the conventional technique, which is provided for processing the insulating film on the fuse to a desired thickness, becomes unnecessary, and thus the number of steps can be reduced. That is, in this embodiment, the metal plug can be formed on a fuse while reducing the number of steps. Further, the area of the fuse meltdown area is made smaller as compared to the conventional case, and therefore it becomes possible to achieve a higher density of the fuse region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a first insulating film provided on the semiconductor substrate;

a first fuse element having a meltdown region, provided on the first insulating film;

a second insulating film formed on the fuse element and the first insulating film, the second insulating film having an opening; and a first metal plug formed in the opening and on the meltdown region of the first fuse element.

2. A semiconductor device according to claim 1, wherein the first metal plug has a concave cross-section.

3. A semiconductor device according to claim 1, wherein the first metal plug has a portion projecting on a surface of the second insulating film.

4. A semiconductor device according to claim 1, further comprising an element separation film formed on the semiconductor substrate, wherein the opening formed in the second insulating film is above the element separation film, and the first metal plug is above the element separation film.

5. A semiconductor device according to claim 4, wherein the first metal plug has a concave cross-section.

6. A semiconductor device according to claim 4, wherein the first metal plug has a portion projecting on a surface of the second insulating film.

7. A semiconductor device according to claim 1, further comprising an element separation film formed on the semiconductor substrate, wherein the first insulating film has an opening, a second metal plug is provided in the opening formed in the first insulating film, the opening formed in the first insulating film is outside the element separation film, the opening formed in the second insulating film is outside the element separation film, and the first metal plug formed in the opening of the second insulating film is outside the element separation film.

8. A semiconductor device according to claim 7, wherein the first metal plug has a concave cross-section.

9. A semiconductor device according to claim 7, wherein the first metal plug has a portion projecting on a surface of the second insulating film.

10. A semiconductor device according to claim 1, further comprising an element separation film formed on the semiconductor substrate, a second fuse element formed on the first insulating film, and a third insulating film having an opening, provided between the first insulating film and the first fuse element, a second metal plug provided in the opening formed in the third insulating film, wherein the opening formed in the third insulating film is above the element separation film, the second metal plug provided in the opening formed in the third insulating film is above the element separation film, the opening formed in the second insulating film is above the element separation film, and the first metal plug formed in the opening of the second insulating film is above the element separation film.

11. A semiconductor device according to claim 10, wherein the first metal plug has a concave cross-section.

12. A semiconductor device according to claim 10, wherein the first metal plug has a portion projecting on a surface of the second insulating film.

13. A semiconductor device comprising:

a semiconductor substrate;

a first insulating film provided on the semiconductor substrate;

a fuse element provided on the first insulating film;

a second insulating film formed on the fuse element and the first insulating film, the second insulating film having an opening; and a metal plug formed in the opening and on a meltdown region of the first fuse element, and having an exposed upper surface, so that a beam is irradiated onto the exposed upper surface of the metal plug to breakdown the fuse element.

* * * * *